METHOD OF PRODUCING THYRISTORS BY DIFFUSION IN SEMICONDUCTOR MATERIAL

Filed March 16, 1965

United States Patent Office 3,342,651
Patented Sept. 19, 1967

3,342,651

METHOD OF PRODUCING THYRISTORS BY DIFFUSION IN SEMICONDUCTOR MATERIAL

Kurt Raithel, Uttenreuth, Germany, assignor to Siemens-Schuckertwerke Aktiengesellschaft, Berlin-Siemensstadt, Germany, a corporation of Germany Filed Mar. 16, 1965, Ser. No. 440,162
Claims priority, application Germany, Mar. 18, 1964, S 90,097; Aug. 8, 1964, S 92,536
2 Claims. (Cl. 148—188)

ABSTRACT OF THE DISCLOSURE

Described is a method of producing a pnpn-thyristor having a monocrystalline silicon wafer with four regions of alternately opposed conductance type forming three p-n junctions with each other. The method comprises covering one flat side of the wafer with a gold coating of 0.1 to 0.5 micron thickness, heating the coated wafer to a diffusion temperature of approximately 820° C. until the gold has diffused into the wafer down to the depth of the middle p-n junction, and then abruptly cooling the wafer at a rate of more than 50° C. per minute.

Figures 1, 2, 3, 4, 5, 6:
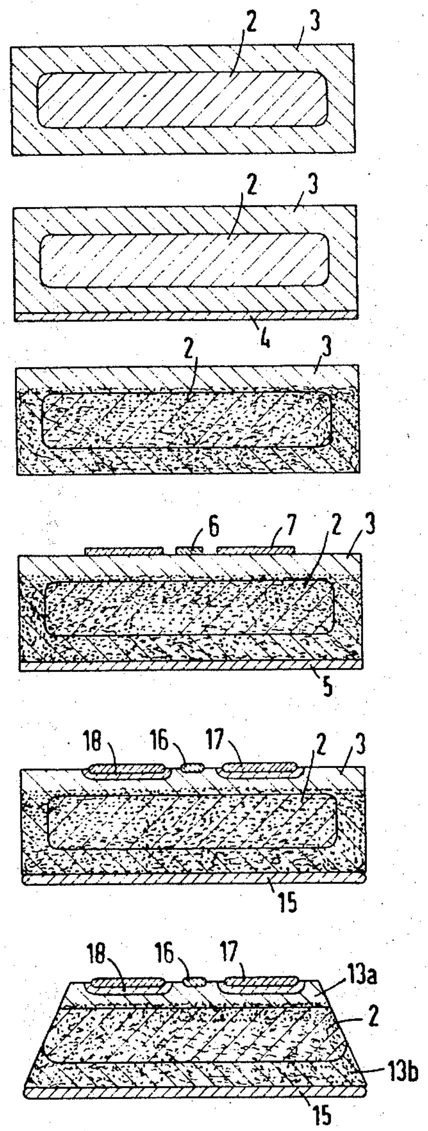

My invention relates to a method of producing semiconductor controlled rectifiers of the pnpn type, also called thyristors. Such devices have a substantially monocrystalline body of semiconductor material, such as silicon, which contains four junction-forming regions of alternately different types of conductance. Various methods for their production have become known. Usually, a region of one conductance type is produced by diffusing a dopant into a crystalline semiconductor wafer of the opposed conductance type such as n-type silicon for example, the diffusion-doped region enveloping the entire crystal. By dividing this region into two parts there results a three-layer member in which a fourth layer can be produced by alloying onto one flat side an electrode which contains dopant suitable to produce the conductance type opposed to that which the semiconductor material possesses at this place. For example, a p-type region can be produced by diffusing aluminum, gallium or boron into an n-type body, then etching into this region a groove having a shape closed upon itself so as to divide the p-type region into two separate regions, whereupon a foil containing a donor substance is alloyed into one of these two p-type regions, whereby an n-type region covered by a contact electrode is obtained.

It is an object of my invention to provide an improved method for producing such thyristors by means of simple and readily performable steps resulting in improved thyristor operational properties, particularly improved properties relating to the so-called turn-off time.

The turn-off time of a thyristor is the interval required after turn-off to regain control of the full blocking voltage in the forward direction of thyristor conductance, i.e. without self-firing of the thyristor. The turn-off time essentially depends, aside from the outer data of the circuit in which the thyristor is connected, on the properties of the thyristor in the zone of the middle pn-junction. If this zone contains a sufficient number of recombination centers to provide for recombination of the charge-carrier pairs after cessation of the current flow, the full blocking ability of this pn-junction is restored in a relatively short time. This is particularly important for using thyristors in frequency ranges other than the customary 50 or 60 Hz. (c.p.s.), such as for chopper operation or similar operating conditions, for example.

According to my invention, a pnpn-thyristor with a substantially monocrystalline semiconductor body, particularly a wafer or disc of silicon, having four junction forming regions of alternating types of conductance is produced by diffusing a recombination-center impurity from one flat side of the semiconductor crystal down to the middle pn-junction, and then suddenly lowering the diffusion temperature after the prescribed diffusion depth is reached. Preferably the diffusion temperature is lowered at a rate of more than 50° C. per minute. Particularly advantageous is a cooling rate of 250° to 550° C. per minute, preferably about 400° C. per minute, within the temperature range down to 500° C.

The invention will be explained in detail with reference to an example from which further advantages will be apparent.

FIGS. 1 to 6 show schematically in cross section a specimen in progressive stages of manufacture starting from a circular wafer and ending with a completed thyristor. For the purpose of illustration, the semiconductor body is shown greatly enlarged, and also distorted by disproportionally increasing the thickness dimensions relative to the width of the semiconductor body.

In the example described presently, the process is started by using a wafer (FIG. 1) of n-type silicon having a specific resistance of 20 to 40 ohm cm. The wafer has the shape of a circular disc of 18 mm. diameter and about 300$\mu$ thickness. An acceptor substance such as aluminum or gallium is diffused into the n-type disc from all sides, this may be done, for example, by placing a number of such discs and simultaneously an acceptor impurity source into a quartz tube. The tube is then sealed and heated. Now the acceptor impurity diffuses from all sides into the silicon body. In the present example, aluminum was used as acceptor and was diffused into the silicon disc at a temperature of 1230° C. for a period of 35 hours. A p-type region 3 of about 70 microns thickness was thus produced on all sides of the n-type region 2 in which the original silicon material remained unaffected by the diffusion treatment.

The enveloping diffusion region 3 may also be produced with both aluminum and gallium acting as acceptors, and these two substances may be in-diffused simultaneously or successively. One way, for example, is to subject the above-described n-type silicon disc to in-diffusion of aluminum at 1230° C. for 8 hours and then to in-diffusion of gallium for about 30 hours with the silicon discs at 1230° C. and the source gallium kept at 950° C.

With the specimen in the condition shown in FIG. 1, a recombination-center substance is vapor deposited upon the semiconductor body. FIG. 2 shows the resulting coating 4 on one flat side of the semiconductor disc. Gold, iron, magnesium, copper, and zinc are well suitable recombination-center substances. In the present example, gold was vaporized onto the crystal. The thickness of the gold coating may be between 0.1 and 0.5$\mu$ and is preferably about 0.2$\mu$.

This gold is then diffused into the semiconductor body by heating. This is preferably done in a non-oxidizing atmosphere, such as in the protective gas or in vacuum, at a temperature of about 820° C. which is maintained for about 20 minutes. The gold disperses into the semiconductor body and penetrates to approximately such a depth that the state shown in FIG. 3 is reached. The gold is distributed within the volume indicated by dotted shading. Starting from the flat bottom side, the gold has penetrated through the entire adjacent part of the region 3, the entire region 2 and, on the other side, also fills a small portion of the region 3, so that at this locality the pn-junction between regions 2 and 3 is flooded with recombination centers.

I have found that the speed at which this temperature treatment is terminated, has a decisive effect upon the quality of the resulting product. If the heat treatment at 820° C. is terminated by slow cooling, the results are inferior to those attained if the temperature of 820° C. is suddenly lowered to a room temperature. It is preferable, therefore, to enforce an abrupt drop in temperature by artificial cooling, such as by passing protective gas over the specimen. It is advisable to thus cool the semiconductor body in less than 5 minutes, for example in about 4 minutes, from 820° C. to 20° C. The rate of the temperature drop is preferably higher than 50° per minute, and should initially approach 100° per minute. It is most advantageous, however, to cool the semiconductor body in the higher temperature range down to about 500° C. at a rate between 250° and 550° C. per minute, preferably about 400° C. per minute.

The effect of this process may be explained by assuming that the constitution attained becomes frozen due to the sudden cooling. In a crystal there are always a number of dislocations. It must therefore be assumed that with slow cooling the atoms of the in-diffused substance, gold atoms for example, collect at the dislocations for lack of solubility. The originally uniform distribution is eliminated and thereby the desired effect thus obviated. If now, according to the invention, the temperature is abruptly lowered the gold atoms can no longer collect at the dislocations but freeze at the place occupied at this moment.

After in-diffusion of gold, a residue of gold may still be left on the one flat side. In most cases it is not necessary to remove this gold.

FIG. 4 represents a further method step. The side of the semiconductor body from which the gold was in-diffused is covered with an aluminum foil 5, for example of 50 micron thickness. Placed upon the other flat side of the semiconductor body is a boron-containing gold foil 6, for example of 5 mm. diameter, and also a ring-shaped gold foil 7 which surrounds the foil 6 and contains antimony as doping substance. Both doping foils may be about 45$\mu$ thick. The ensemble is heated to about 750° C. As a result the foils 5, 6 and 7 are alloyed in. This results in a member as shown in FIG. 5. An electrode 15, formed from aluminum foil 5, covers the one flat side of region 3, and an electrode 16, formed from foil 6, contacts the region 3 on the other side. The foil 7 has formed an electrode 17 on a newly formed region 18 of n-type conductance.

FIG. 6 shows the last step of the production method. The marginal portion of the body is removed along the entire periphery. This is done by milling or sand blasting, for example. As a result, region 3 is divided into the two regions 13*a* and 13*b*, resulting in a four-layer semiconductor device having two outer regions 13*b*, 18 and two inner regions 2 and 13*a*. The middle pn-junction between regions 2 and 13*a* is provided with recombination centers which are able to aid in shortening the turn-off time.

Electrodes 15 and 17 serve as terminals at the two outer layers of the thyristor. The electrode 16 serves as firing electrode for the supply of ignition current to flow through the pn-junction between regions 13*a* and 18.

After completion, the entire semiconductor member may be etched in the usual manner and encapsulated in a housing. The member may be joined with parts of the housing in known manner, such as by alloying or by means of pressure contacts.

It will be obvious that various changes in the example described may be made. Thus various process steps may be interchanged. For example, the separation of region 3 into regions 13*a* and 13*b* may be carried out at an earlier stage of the process. It is also possible to diffuse the recombination-center impurity from the other flat side into the semiconductor body. This offers the advantage of shortening the migrations path for the diffusing material, but has the disadvantage that the recombination centers have a relatively high edge concentration at the disc side where the electrodes 16 and 17 are to be located.

I claim:

1. The method of producing a pnpn-thyristor having a monocrystalline silicon wafer with four regions of alternately opposed conductance type forming three p-n junctions with each other, which comprises covering one flat side of the wafer with a gold coating of 0.1 to 0.5 micron thickness, heating the coated wafer to a diffusion temperature of approxitmately 820° C. until the gold has diffused into the wafer down to the depth of the intermediate one of said p-n junctions, and then abruptly cooling the wafer at a rate of more than 50° C. per minute.

2. The method of producing a pnpn-thyristor having a monocrystalline silicon wafer with four regions of alternately opposed conductance type forming three p-n junctions with each other, which comprises vaporizing onto one flat side of the wafer a coating of finely distributed gold having a layer thickness of 0.1 to 0.5 micron, heating the coated wafer in a non-oxidizing atmosphere to a diffusion temperature of approximately 820° C. until the gold has diffused into the wafer down to the depth of the intermediate one of said p-n junctions, and then abruptly cooling the wafer within less than 5 minutes from the diffusion temperature down to normal room temperature.

References Cited

UNITED STATES PATENTS

| | | | |
|---|---|---|---|
| 2,827,436 | 3/1958 | Bemski | 148—186 X |
| 2,964,689 | 12/1960 | Buschert | 148—177 X |
| 3,067,485 | 12/1962 | Ciccolella | 148—188 X |
| 3,272,661 | 9/1966 | Masami Tomo | 148—1.5 |

HYLAND BIZOT, *Primary Examiner.*